United States Patent
Joung et al.

(10) Patent No.: US 8,999,797 B2
(45) Date of Patent: Apr. 7, 2015

(54) SEMICONDUCTOR DEVICE WITH AIR GAPS AND METHOD FOR FABRICATING THE SAME

(71) Applicant: SK Hynix Inc., Gyeonggi-do (KR)

(72) Inventors: Yong-Soo Joung, Gyeonggi-do (KR); Hyung-Kyun Kim, Gyeonggi-do (KR); Jae-Soo Kim, Gyeonggi-do (KR); Dong-Gun Hwang, Gyeonggi-do (KR); Kyoung Yoo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/454,407

(22) Filed: Aug. 7, 2014

(65) Prior Publication Data
US 2014/0357076 A1    Dec. 4, 2014

Related U.S. Application Data

(62) Division of application No. 13/844,921, filed on Mar. 16, 2013, now Pat. No. 8,828,829.

(30) Foreign Application Priority Data

Dec. 26, 2012    (KR) .................. 10-2012-0153820

(51) Int. Cl.
| H01L 21/336 | (2006.01) |
| H01L 21/768 | (2006.01) |
| H01L 27/108 | (2006.01) |
| H01L 21/764 | (2006.01) |
| H01L 23/532 | (2006.01) |
| H01L 23/522 | (2006.01) |

(52) U.S. Cl.
CPC ...... *H01L 21/76879* (2013.01); *H01L 21/7682* (2013.01); *H01L 23/53295* (2013.01); *H01L 27/10855* (2013.01); *H01L 21/76897* (2013.01); *H01L 21/76834* (2013.01); *H01L 27/10885* (2013.01); *H01L 23/5222* (2013.01); *H01L 21/764* (2013.01); *H01L 21/7685* (2013.01)

(58) Field of Classification Search
CPC ..................................................... H01L 21/00
USPC .......... 438/253, 396, 240, 250, 393, 422, 619
See application file for complete search history.

(56) References Cited

U.S. PATENT DOCUMENTS

| 8,198,189 B2* | 6/2012 | Kim et al. ...... 438/619 |
| 8,344,517 B2* | 1/2013 | Kim et al. ...... 257/774 |
| 2002/0158338 A1* | 10/2002 | Ohtsuka et al. ...... 257/758 |
| 2006/0175655 A1* | 8/2006 | Yoshino et al. ...... 257/317 |
| 2010/0285662 A1* | 11/2010 | Kim et al. ...... 438/675 |
| 2012/0168899 A1* | 7/2012 | Kim et al. ...... 257/522 |
| 2012/0217631 A1* | 8/2012 | Kim et al. ...... 257/734 |
| 2012/0267701 A1* | 10/2012 | Chae et al. ...... 257/324 |
| 2012/0276711 A1* | 11/2012 | Yoon et al. ...... 438/421 |
| 2013/0320549 A1* | 12/2013 | Lee et al. ...... 257/773 |
| 2013/0320550 A1* | 12/2013 | Kim ...... 257/773 |

* cited by examiner

*Primary Examiner* — Telly Green
(74) *Attorney, Agent, or Firm* — IP & T Group LLP

(57) ABSTRACT

A method for fabricating a semiconductor device includes forming a plurality of bit line structures over a substrate, forming contact holes between the bit line structures, forming sacrificial spacers on sidewalls of the contact holes, forming first plugs recessed inside the contact holes, forming air gaps by removing the sacrificial spacers, forming conductive capping layers capping the first plugs and the air gaps, and forming second plugs over the conductive capping layers.

6 Claims, 12 Drawing Sheets

SEMICONDUCTOR DEVICE WITH AIR GAPS AND METHOD FOR FABRICATING THE SAME

CROSS-REFERENCE TO RELATED APPLICATIONS

The present application claims priority of Korean Patent Application No. 10-2012-0153820, filed on Dec. 26, 2012, which is incorporated herein by reference in its entirety.

BACKGROUND

1. Field

Exemplary embodiments of the present invention relate to a semiconductor device, and more particularly, to a semiconductor device having air gaps and a method for fabricating the semiconductor device.

2. Description of the Related Art

Generally, a semiconductor device includes a plurality of first conductive structures and second conductive structures, wherein each of the second conductive structures is formed between adjacent first conductive structures and an insulation layer is disposed between the first conductive structures and the second conductive structure. For example, the first conductive structures include gates, bit lines, and metal lines. The second conductive structures include contact plugs, storage node contact plugs, bit line contact plugs, and vias.

As semiconductor devices are highly integrated, the gaps between the first conductive structures and the second conductive structures become narrower and narrower. The narrowing gaps between the first conductive structures and the second conductive structures increase parasitic capacitance. The increase in the parasitic capacitance makes semiconductor devices operate slowly and deteriorates refresh characteristics of the semiconductor devices.

The dielectric rate of an insulation layer may be decreased in order to reduce the parasitic capacitance. Generally, silicon oxide or silicon nitride is used to form an insulation layer in a semiconductor device. The dielectric rate of silicon oxide is approximately 4, and the dielectric rate of silicon nitride is approximately 7.

Since the silicon oxide and the silicon nitride still have high dielectric rates, there may be limitation in decreasing the parasitic capacitance by using the silicon oxide and silicon nitride. Recently, researchers are studying to develop materials having a relatively low dielectric rate, but their dielectric rates may be not sufficiently low.

SUMMARY

Exemplary embodiments of the present invention are directed to a semiconductor device that may decrease the parasitic capacitance between neighboring conductive structures, and a method for fabricating the semiconductor device.

In accordance with an exemplary embodiment of the present invention, a method for fabricating a semiconductor device includes forming a plurality of bit line structures over a substrate, forming contact holes between the bit line structures, forming sacrificial spacers on sidewalls of the contact holes, forming first plugs recessed inside the contact holes, forming air gaps by removing the sacrificial spacers, forming conductive capping layers capping the first plugs and the air gaps, and forming second plugs over the conductive capping layers.

In accordance with another exemplary embodiment of the present invention, a method for fabricating a semiconductor device includes forming a plurality of bit line structures over a substrate, forming contact holes between the bit line structures, forming sacrificial spacers on sidewalls of the bit line structures, forming first plugs recessed inside the contact holes, forming air gaps by removing the sacrificial spacers, forming protective layers on sidewalls of the first plugs, forming conductive capping layers capping the first plugs and the air gaps, and forming second plugs over the conductive capping layers.

In accordance with yet another exemplary embodiment of the present invention, a semiconductor device includes bit line structures formed over a substrate, first storage node contact plugs recessed between the bit line structures, air gaps formed between sidewalls of the bit line structures and the first storage node contact plugs, conductive capping layers capping the first storage node contact plugs and the air gaps, and second storage node contact plugs formed over the conductive capping layers.

The semiconductor device may further comprise protective layers formed on sidewalls of the first storage node contact plugs.

The protective layers may include oxides of materials of the respective first storage node contact plugs.

The conductive capping layers may include silicon-containing layers.

The first storage node contact plugs and the conductive capping layers may include silicon.

The first storage node contact plugs may include polysilicon layers, and the conductive capping layer may include silicon layers that are formed from surfaces of the polysilicon layers through a selective epitaxial growth process.

The second storage node contact plugs may include tungsten layers.

DETAILED DESCRIPTION

Figure 1:
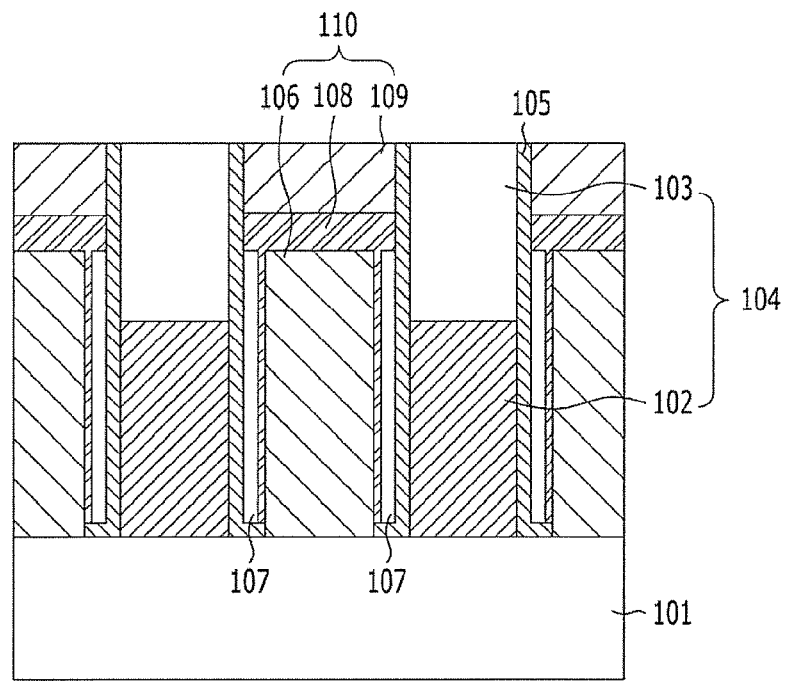
FIG. 1 is a cross-sectional view illustrating a semiconductor device in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a cross-sectional view illustrating a semiconductor device in accordance with a first embodiment of the present invention.

Referring to FIG. 1, a plurality of conductive structures are formed over a substrate 101. The conductive structures may include first conductive structures 104 and second conductive structures 110. Air gaps 107 may be formed between the first conductive structures 104 and the second conductive structures 110. A capping layer 108 may be formed in the upper portion of the air gaps 107.

The substrate 101 may be a silicon substrate or a silicon germanium substrate. Also, the substrate 101 may be an SOI (Silicon On Insulator) substrate.

Each of the first conductive structures 104 may include a first conductive layer 102. Each of the first conductive structures 104 may be of a stacked structure including the first conductive layer 102 and a hard mask layer 103.

The first conductive layer 102 may include a silicon-containing layer or a metal-containing layer. The first conductive layer 102 may be a stacked layer where a silicon-containing layer and a metal-containing layer are stacked. The first conductive layer 102 may include polysilicon, a metal, a metal nitride, a metal silicide or the like. The first conductive layer 102 may be a stacked layer of a polysilicon layer and a metal layer. The metal layer may include tungsten. The hard mask layer 103 may include an insulating material. The hard mask layer 103 may include an oxide or a nitride. The first conductive structures 104 or the second conductive structures 110 may have a type of lines stretched in any one direction. The other ones that are not of the line type may have a shape of plugs. For example, the first conductive structures 104 may be structures of a line type, while the second conductive structures 110 may be structures of a plug type. The first conductive structures 104 may be regularly disposed over the substrate 101 with a predetermined gap between them.

Each of the second conductive structures 110 may include a second conductive layer 106 recessed between the first conductive structures 104. Each of the second conductive structures 110 may be of a stacked structure where the second conductive layer 106, the capping layer 108 and a third conductive layer 109 are stacked. The capping layer 108 may cover the upper portion of the second conductive layer 106 and cap the air gaps 107. The capping layer 108 may include a conductive material. The capping layer 108 may include a silicon-containing layer. The capping layer 108 may include an epitaxial silicon layer or a polysilicon layer. The capping layer 108 may be formed on the surface of the upper portion of the second conductive layer 106 through a selective epitaxial growth process, which will be described later. The second conductive layer 106 may include a silicon-containing layer. The second conductive layer 106 may include a polysilicon layer. The third conductive layer 109 may include a metal-containing layer. The third conductive layer 109 may include a metal, a metal silicide, a metal nitride or the like. The third conductive layer 109 may be a stacked layer of a barrier layer and a metal layer. The barrier layer may include a metal nitride. The third conductive layer 109 may include a material having titanium or tungsten as its major component.

Spacers 105 may be formed on both sidewalls of each of the first conductive structures 104. Each of the spacers 105 may include an insulating material. Each of the spacers 105 may include an oxide or a nitride. The spacers 105 may insulate the first conductive structures 104 and the second conductive structures 110 from each other along with the air gaps 107.

The first conductive structures 104 or the second conductive structures 110 may include gates and bit lines, and the other ones that do not include the gates and the bit lines may include contact plugs. The contact plugs may include storage node contact plugs and landing plugs. In FIG. 1, the first conductive layers 102 of the first conductive structures 104 may include bit lines, and the second conductive structures 110 may include storage node contact plugs. Therefore, the air gaps 107 may be formed between the bit lines and the storage node contact plugs. Each of the storage node contact plugs may have a structure including the second conductive layer 106, the capping layer 108, and the third conductive layer 109. The second conductive layer 106 may be a first plug, and the third conductive layer 109 may be a second plug. The capping layer 108 may be formed between the first plug and the second plug. Since the first plug includes a silicon-containing layer and the second plug includes a metal-containing layer, each of the storage node contact plugs may have a stacked structure where a silicon-containing plug and a metal-containing plug are stacked. According to another embodiment of the present invention, the first conductive layers 102 of the first conductive structures 104 may include gate electrodes, and the second conductive structures 110 may include contact plugs.

As illustrated in FIG. 1, the air gaps 107 are formed between the first conductive structures 104 and the second conductive structures 110. The air gaps 107 have a dielectric rate of approximately 1 and the air gaps 107 decrease the parasitic capacitances between the first conductive structures 104 and the second conductive structures 110. Also, the upper portions of the air gaps 107 are hermetically sealed by the capping layer 108.

Since the capping layer 108 capping the air gaps 107 is formed of a conductive material and the capping layer 108 caps the upper portion of the second conductive layer 106, the air gaps 107 may be sufficiently capped while not opened. Also, an open margin to gap-fill the third conductive layer 109 may be secured. Since the spacers 105 are formed, shorts between the first conductive structures 104 and the second conductive structures 110 may be prevented.

FIGS. 2A to 2H are cross-sectional views illustrating a method for fabricating the semiconductor device in accordance with the first embodiment of the present invention.

Figure 2A:
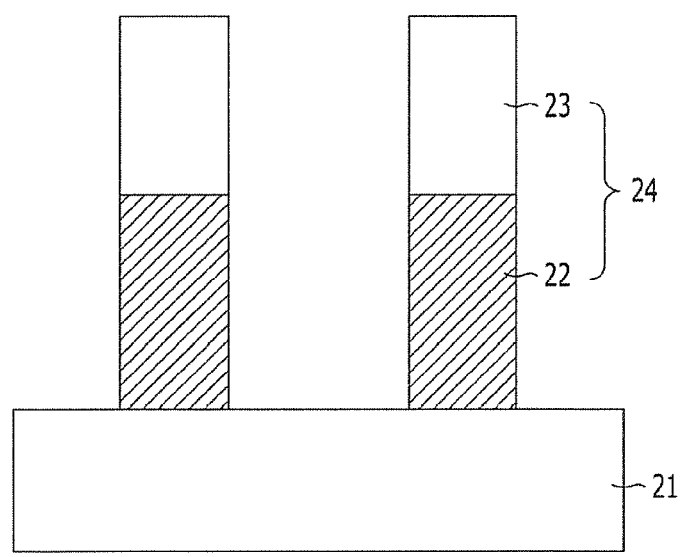
FIGS. 2A to 2H are cross-sectional views illustrating a method for fabricating the semiconductor device in accordance with the first embodiment of the present invention.

Referring to FIG. 2A, a plurality of first conductive structures 24 are formed over a substrate 21. The substrate 21 may include silicon. The substrate 21 may be a silicon substrate or a silicon germanium substrate. Also, the substrate 21 may be an SOI (Silicon On Insulator) substrate.

The first conductive structures 24 formed over the substrate 21 may be of a line type where lines are regularly disposed with a predetermined gap between them. To form each of the first conductive structures 24, a hard mask pattern 23 is formed over a first conductive layer. A first conductive layer pattern 22 is formed by using the hard mask pattern 23 as an etch mask and etching the first conductive layer. Each of the first conductive structures 24 has a stacked structure where the first conductive layer pattern 22 and the hard mask pattern 23 are stacked. The first conductive layer pattern 22 may include a silicon-containing layer or a metal-containing layer. For example, the first conductive layer pattern 22 may include a polysilicon layer or a tungsten layer. Also, the first conductive layer pattern 22 may be a stacked layer where a polysilicon layer and a metal layer are stacked. Herein, a barrier layer may be further formed between the polysilicon layer and the metal layer. The first conductive layer pattern 22 may be a stacked structure where a polysilicon layer, a titanium-containing layer, and a tungsten layer are stacked. The titanium-containing layer is a barrier layer and it may be a stacked layer of a titanium layer and a titanium nitride layer.

Figure 2B:
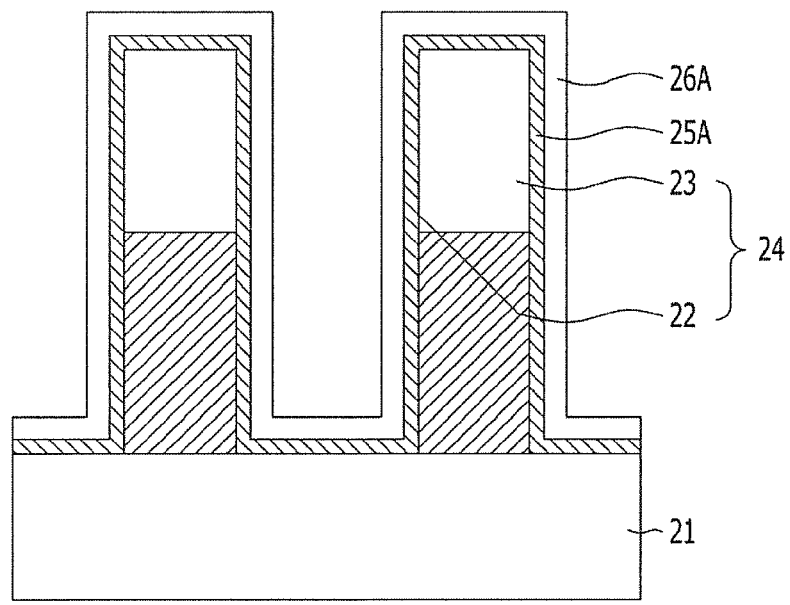

Referring to FIG. 2B, an insulation layer 25A is formed over the substrate 21 including the first conductive structures 24. The insulation layer 25A may include a nitride or an oxide. The insulation layer 25A may include silicon nitride or silicon oxide. The insulation layer 25A becomes spacers later.

A sacrificial layer 26A is formed over the insulation layer 25A. The sacrificial layer 26A is removed in the subsequent process so as to form air gaps. The sacrificial layer 26A may include a material having an etch selectivity with respect to the insulation layer 25A. The sacrificial layer 26A may include an oxide, a nitride, or a metal nitride. When the insulation layer 25A includes an oxide, the sacrificial layer 26A may include a metal nitride or a nitride. When the insulation layer 25A includes a nitride, the sacrificial layer 26A may include a metal nitride or an oxide. The sacrificial layer 26A may include silicon oxide, silicon nitride, or titanium nitride (TiN).

Figure 2C:
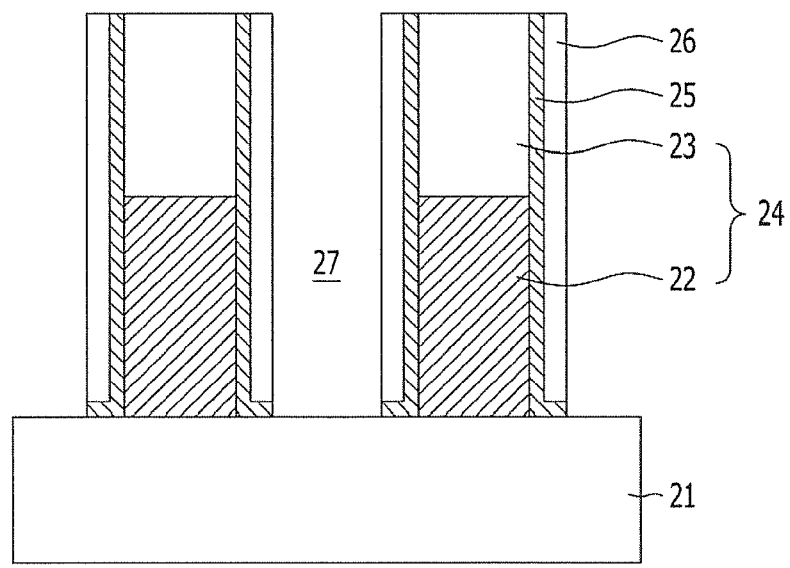

Referring to FIG. 2C, double spacers are formed on both sidewalls of each of the first conductive structures 24. The double spacers may include spacers 25 and sacrificial spacers 26. The spacers 25 may be formed by etching the insulation layer 25A. The sacrificial spacers 26 may be formed on the sidewalls of the spacers 25. The sacrificial spacers 26 may be formed by etching the sacrificial layer 26A. An etch-back process may be performed to form the spacers 25 and the sacrificial spacers 26.

Opening 27 exposing the substrate 21 between the first conductive structures 24 may be formed by forming the spacers 25 and the sacrificial spacers 26. According to another embodiment of the present invention, an inter-layer dielectric layer (not shown) is formed after the spacers 25 are formed, and then the openings 27 may be formed by etching the inter-layer dielectric layer (not shown). The openings 27 may be formed to expose the sidewalls of the sacrificial spacers 26. The openings 27 may have a shape of lines or a shape of contact holes. For example, when the first conductive structures 24 include bit line structures, the openings 27 may include storage node contact holes. After the openings 27 are formed, the sacrificial spacers 26 may be formed by forming the sacrificial layer 26A and then performing an etch-back process on the sacrificial layer 26A.

Figure 2D:
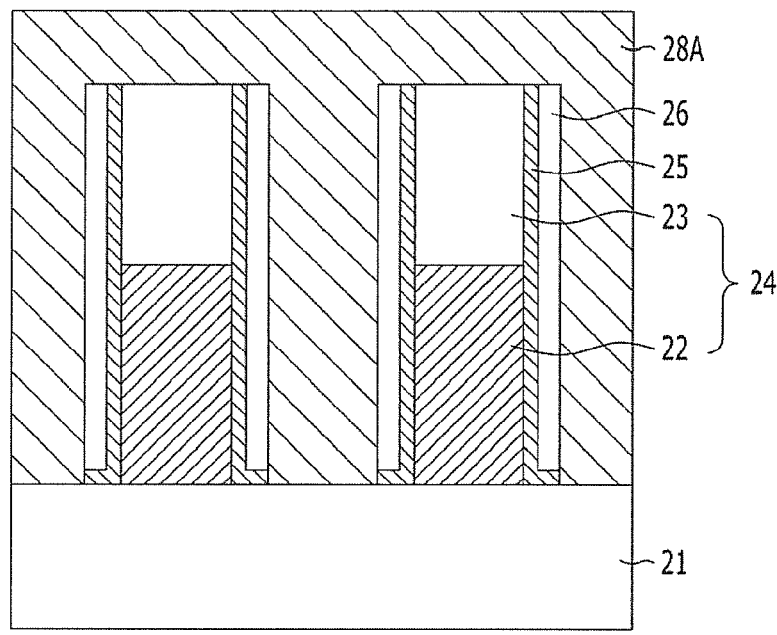

Referring to FIG. 2D, a second conductive layer 28A is formed to gap-fill the openings 27. The second conductive layer 28A may include a silicon-containing layer. The second conductive layer 28A may include a polysilicon layer.

Figure 2E:
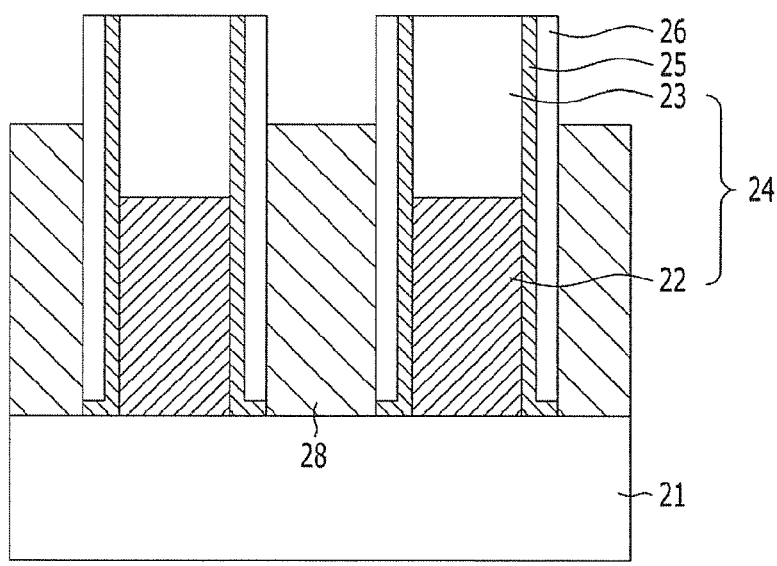

Referring to FIG. 2E, the second conductive layer 28A is selectively removed. As a result, a second conductive layer pattern 28 is recessed between the first conductive structures 24. An etch-back process may be performed to form the second conductive layer pattern 28. The recessed surface of the second conductive layer pattern 28 is lower than the surfaces of the first conductive structures 24. The recessed surface of the second conductive layer pattern 28 may be controlled to be higher than at least the surface of the upper portion of the first conductive layer pattern 22. The second conductive layer pattern 28 may have a height that minimizes the facing area to the first conductive layer pattern 22. In this way, the parasitic capacitance between the first conductive layer pattern 22 and the second conductive layer pattern 28 may be decreased. The second conductive layer patterns 28 may be contact plugs. When the first conductive structures 24 include bit line structures, the second conductive layer patterns 28 may be parts of storage node contact plugs. When the second conductive layer pattern 28 is formed, the spacers 25 and the sacrificial spacers 26 are not etched due to their selectivities.

Figure 2F:
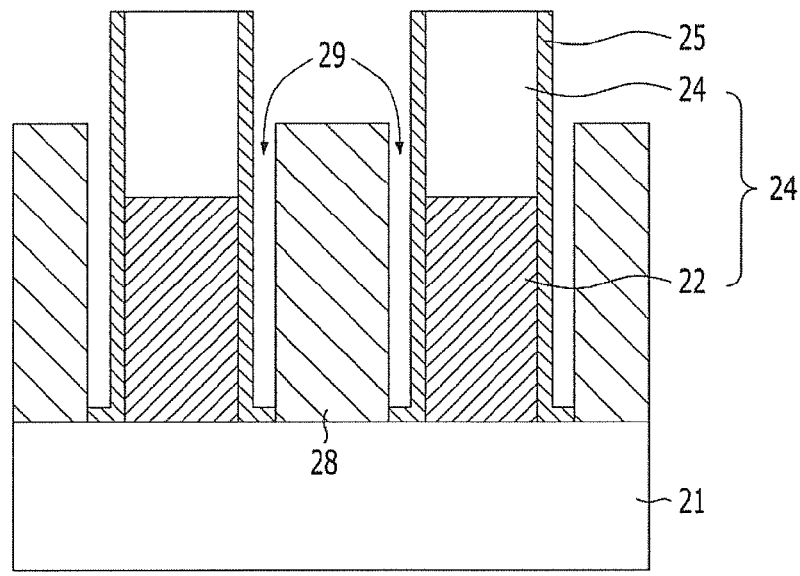

Referring to FIG. 2F, the sacrificial spacers 26 are selectively removed. As a result, air gaps 29 are formed. The air gaps 29 may be formed on the sidewalls of the second conductive layer pattern 28. The air gaps 29 are formed between the second conductive layer pattern 28 and the first conductive layer pattern 22. An insulation structure of 'air gaps-spacers' is formed between the first conductive layer pattern 22 and the second conductive layer pattern 28.

A wet etch process or a dry etch process may be used to remove the sacrificial spacers 26. When the sacrificial spacers 26 are removed, the spacers 25, the second conductive layer pattern 28, and the hard mask pattern 23 are not damaged due to their selectivities. When each of the sacrificial spacers 26 includes titanium nitride, a wet cleaning process using a mixed solution of $H_2SO_4$ and $H_2O_2$ may be performed.

As described above, the parasitic capacitance between the first conductive layer pattern 22 and the second conductive layer pattern 28 is decreased by forming the air gaps 29.

Figure 2G:
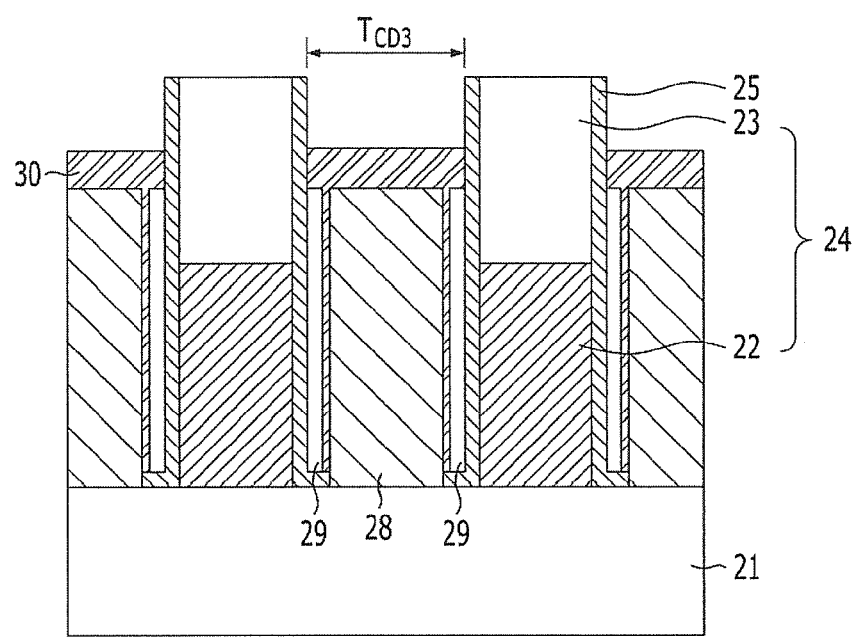

Referring to FIG. 2G, a capping layer 30 for capping the air gaps 29 is formed. The capping layer 30 may include a conductive material. The capping layer 30 may be formed through an epitaxial growth process. The capping layer 30 may be formed through a Selective Epitaxial Growth (SEG) process. The capping layer 30 may include a silicon-containing layer. The capping layer 30 may include a silicon epitaxial layer that is grown through the selective epitaxial growth process. The capping layer 30 may be formed through the selective epitaxial growth process from the surface of the second conductive layer pattern 28. For example, since the second conductive layer pattern 28 includes a silicon-containing layer, it may be possible to grow the capping layer 30 containing silicon over the second conductive layer pattern 28 through the selective epitaxial growth process. The capping layer 30 may be grown from the sidewalls of the second conductive layer pattern 28, and as a result, all the exposed surfaces of the second conductive layer pattern 28 may be capped. Since the entrances of the air gaps 29 are filled due to facet characteristics when the selective epitaxial growth process is performed, the capping layer 30 may be grown thin on the sidewalls of the second conductive layer pattern 28. Therefore, the air gaps 29 are not gap-filled by the capping layer 30. When the capping layer 30 is grown through the selective epitaxial growth process, the capping layer 30 is grown relatively thin on the sidewalls of the second conductive layer pattern 28, in the air gaps 29 and grown relatively thick on the surface of the upper portion of the second conductive layer pattern 28, by using the difference in deposition rate over the second conductive layer pattern 28.

As described above, since the capping layer 30 is formed through the selective epitaxial growth process, the surface of the upper portion of the second conductive layer pattern 28 and the air gaps 29 may be capped sufficiently. Also, since the capping layer 30 is formed through the selective epitaxial growth process, it may be possible to prevent the air gaps 29 from being open in the subsequent process.

Since the capping layer 30 is formed to cover the surface of the upper portion of the second conductive layer pattern 28 and not formed on the sidewalls of the upper portion of the opening 27, top open margin $T_{CD3}$ of the opening 27 may be secured. Also, as the capping layer 30 gap-fills a predetermined portion of the upper portion of the opening 27, the aspect ratio of the upper portion of the opening 27 may be decreased.

Figure 2H:
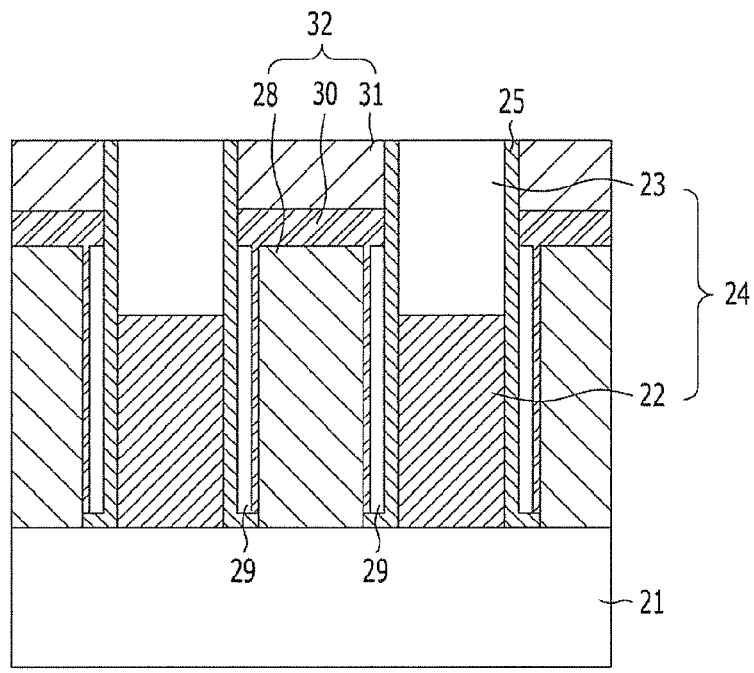

Referring to FIG. 2H, a third conductive layer pattern 31 may be formed over the capping layer 30. The third conductive layer pattern 31 may be formed by forming a third conductive layer that gap-fills the upper portion of the capping layer 30 and then performing a planarization process. The third conductive layer pattern 31 may include a metal-containing layer. The third conductive layer pattern 31 may include a tungsten layer. Although not Illustrated in the drawing, the third conductive layer pattern 31 may further include a barrier layer. Therefore, the third conductive layer pattern 31 may be a stacked layer of a barrier layer and a metal-containing layer. The barrier layer may include a material containing titanium. The barrier layer may be formed of titanium alone, or the barrier layer may be a stacked layer of a titanium layer and a titanium nitride layer. When the third conductive layer pattern 31 includes a material that does not react with the second conductive layer pattern 28, the barrier layer may be omitted.

When the third conductive layer pattern 31 is formed as described above, each of second conductive structures 32 including the second conductive layer pattern 28, the capping layer 30, and the third conductive layer pattern 31 is formed. The air gaps 29 are formed between the first conductive structures 24 and the second conductive structures 32. The second conductive structures 32 may be storage node contact plugs. The second conductive layer pattern 28 may be a bottom plug of each of the storage node contact plugs, and the third conductive layer pattern 31 may be a top plug of each of the storage node contact plugs. Since the second conductive layer pattern 28 includes a silicon-containing layer and the third conductive layer pattern 31 includes a metal-containing layer, the storage node contact plugs including the silicon-containing layers and the metal-containing layers, which are semi-metal contact plugs, may be formed.

The air gaps 29 may be formed between the first conductive layer patterns 22 and the second conductive layer patterns 28. When the first conductive layer patterns 22 include bit lines and the second conductive layer patterns 28 include storage node contact plugs, the air gaps 29 may be formed between the bit lines and the storage node contact plugs. When the first conductive layer patterns 22 include gate electrodes and the second conductive layer patterns 28 include contact plugs, the air gaps 29 may be formed between the gate electrodes and the contact plugs.

Figure 3:
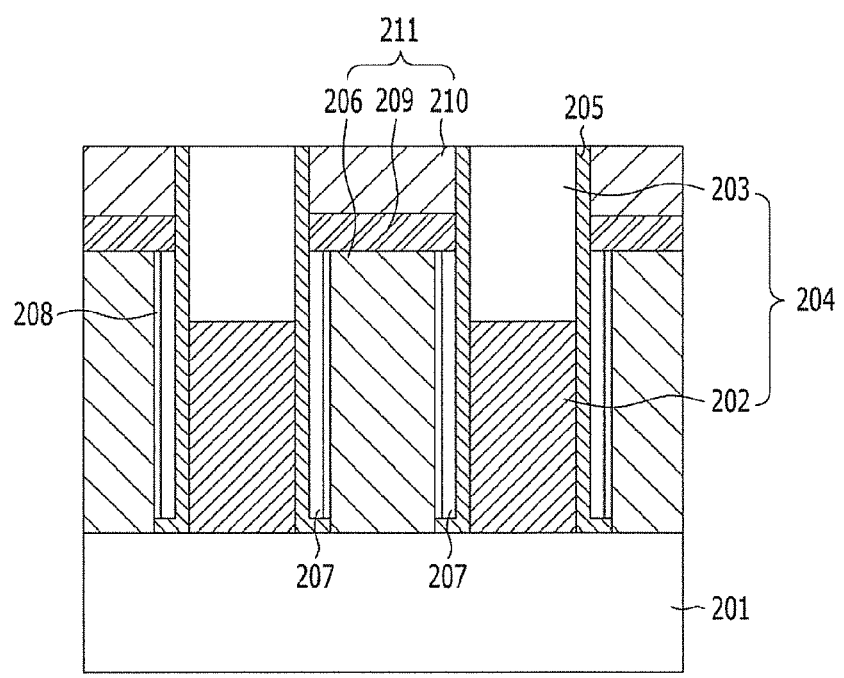
FIG. 3 is a cross-sectional view illustrating a semiconductor device in accordance with a second embodiment of the present invention.

FIG. 3 is a cross-sectional view illustrating a semiconductor device in accordance with a second embodiment of the present invention.

Referring to FIG. 3, a plurality of conductive structures are formed over a substrate 201. The conductive structures may include first conductive structures 204 and second conductive structures 211. Air gaps 207 may be formed between the first conductive structures 204 and the second conductive structures 211. A capping layer 209 may be formed in the upper portion of the air gaps 207.

The substrate 201 may be a silicon substrate or a silicon germanium substrate. Also, the substrate 201 may be an SOI (Silicon On Insulator) substrate.

Each of the first conductive structures 204 may include a first conductive layer 202. Each of the first conductive structures 204 may be of a stacked structure including the first conductive layer 202 and a hard mask layer 203.

The first conductive layer 202 may include a silicon-containing layer or a metal-containing layer. The first conductive layer 202 may be a stacked layer where a silicon-containing layer and a metal-containing layer are stacked. The first conductive layer 202 may include polysilicon, a metal, a metal nitride, a metal silicide or the like. The first conductive layer 202 may be a stacked layer of a polysilicon layer and a metal layer. The metal layer may include tungsten. The hard mask layer 103 may include an insulating material. The hard mask layer 203 may include an oxide or a nitride. The first conductive structures 204 or the second conductive structures 211 may have a type of lines stretched in any one direction. The other ones that are not of the line type may have a shape of plugs. For example, the first conductive structures 204 may be structures of a line type, while the second conductive structures 211 may be structures of a plug type. The first conductive structures 204 may be regularly disposed over the substrate 201 with a predetermined gap between them.

Each of the second conductive structures 211 may include a second conductive layer 206 recessed between the first conductive structures 204. Each of the second conductive structures 211 may be of a stacked structure where the second conductive layer 206, the capping layer 209 and a third conductive layer 210 are stacked. The capping layer 209 may cover the upper portion of the second conductive layer 206 and cap the air gaps 207. The capping layer 209 may include a conductive material. The capping layer 209 may include a silicon-containing layer. The capping layer 209 may include an epitaxial silicon layer or a polysilicon layer. The capping layer 209 may be formed on the surface of the upper portion of the second conductive layer 206 through a selective epitaxial growth process, which will be described later. The second conductive layer 206 may include a silicon-containing layer. The second conductive layer 206 may include a polysilicon layer. The third conductive layer 210 may include a metal-containing layer. The third conductive layer 210 may include a metal, a metal silicide, a metal nitride or the like. The third conductive layer 210 may be a stacked layer of a barrier layer and a metal layer. The barrier layer may include a metal nitride. The third conductive layer 210 may include a material having titanium or tungsten as its major component. A protective layer 208 may be formed on the sidewalls of the second conductive layer 206. The protective layer 208 prevents the capping layer 209 from being formed on the sidewalls of the second conductive layer 206. The protective layer 208 may include an insulation layer. For example, the protective layer 208 may include an oxide of the material of the second conductive layer 206. If the second conductive layer 206 is a silicon-containing layer, the protective layer 208 may include silicon oxide.

Spacers 205 may be formed on both sidewalls of each of the first conductive structures 204. Each of the spacers 205 may include an insulating material. Each of the spacers 205 may include an oxide or a nitride. The spacers 205 may insulate the first conductive structures 204 and the second conductive structures 211 from each other along with the air gaps 207.

The first conductive structures 204 or the second conductive structures 211 may include gates and bit lines, and the other ones that do not include the gates and the bit lines may include contact plugs. The contact plugs may include storage node contact plugs and landing plugs. In FIG. 3, the first conductive layers 202 of the first conductive structures 204 may include bit lines, and the second conductive structures 211 may include storage node contact plugs. Therefore, the air gaps 207 may be formed between the bit lines and the storage node contact plugs. Each of the storage node contact plugs may have a structure including the second conductive layer 206, the capping layer 209, and the third conductive layer 210. The second conductive layer 206 may be a first plug, and the third conductive layer 210 may be a second plug. The capping layer 209 may be formed between the first plug and the second plug. Since the first plug includes a silicon-containing layer and the second plug includes a metal-containing layer, each of the storage node contact plugs may have a stacked structure where a silicon-containing plug and a metal-containing plug are stacked.

As illustrated in FIG. 3, the air gaps 207 are formed between the first conductive structures 204 and the second conductive structures 211. The air gaps 207 have a dielectric rate of approximately 1 and the air gaps 207 decrease the parasitic capacitances between the first conductive structures 204 and the second conductive structures 211. Also, the upper portions of the air gaps 207 are hermetically sealed by the capping layer 209.

Since the capping layer 209 capping the air gaps 207 is formed of a conductive material and the capping layer 209 caps the upper portion of the second conductive layer 206, the air gaps 207 may be sufficiently capped while not opened. Also, an open margin to gap-fill the third conductive layer 210 may be secured. Since the spacers 205 are formed, shorts between the first conductive structures 204 and the second conductive structures 211 may be prevented.

FIGS. 4A to 4D are cross-sectional views illustrating a method for fabricating the semiconductor device in accordance with the second embodiment of the present invention. For the method for forming first conductive structures, a second conductive layer pattern, and air gaps in the method for fabricating the semiconductor device in accordance with the second embodiment, the first embodiment of the present invention is referred to.

Figure 4A:
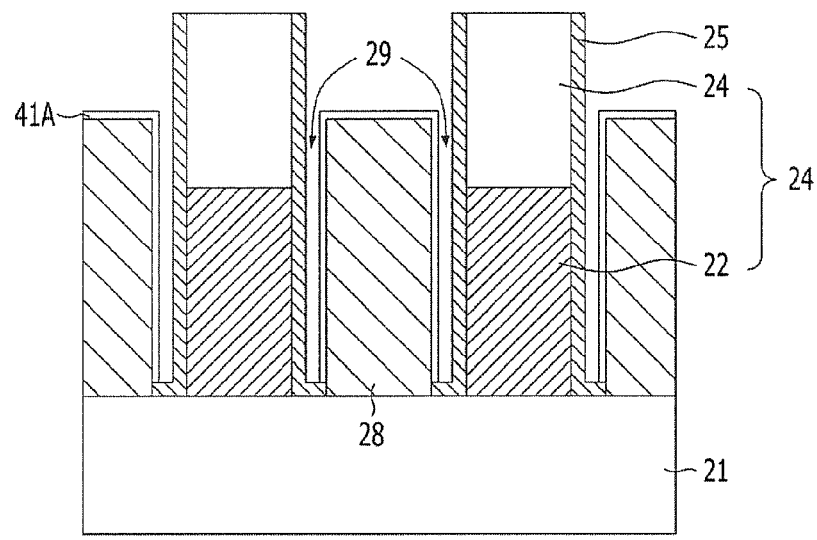
FIGS. 4A to 4D are cross-sectional views illustrating a method for fabricating the semiconductor device in accordance with the second embodiment of the present invention.

Referring to FIG. 4A, air gaps 29 are formed on the sidewalls of the second conductive layer pattern 28. A protective layer 41A is then formed on the sidewalls and the surface of the upper portion of the second conductive layer pattern 28. The protective layer 41A may include an insulating material. The protective layer 41A may include silicon oxide. The protective layer 41A may be formed through an oxidation process. Since the second conductive layer pattern 28 includes a silicon-containing layer, a silicon oxide layer may be formed on the sidewalls and the surface of the upper portion of the second conductive layer pattern 28 through the oxidation process. The protective layer 41A may be formed so thin that it does not gap-fill the air gaps 29. The protective layer 41A may be formed through a deposition process. In this case, the protective layer 41A is deposited so thin that it does not gap-fill the air gaps 29.

The protective layer 41A may be used to selectively form a capping layer on the surface of the upper portion of the second conductive layer pattern 28 in the subsequent Selective Epitaxial Growth (SEG) process.

Figure 4B:
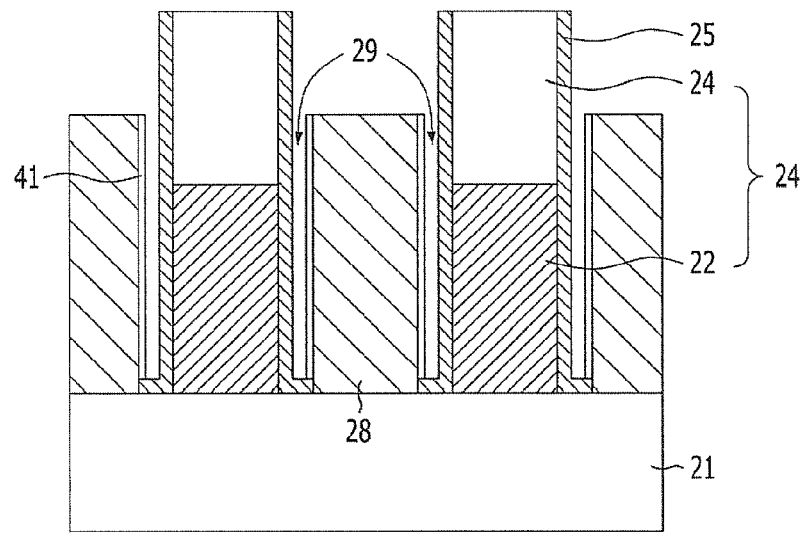

Referring to FIG. 4B, the protective layer 41A is selectively removed. As a result, the surface of the upper portion of the second conductive layer pattern 28 may be exposed. An etch-back process may be performed to remove the protective layer 41A from the surface of the upper portion of the second conductive layer pattern 28.

As described above, the protective layer 41A may remain on the sidewalls of the second conductive layer pattern 28 by being selectively removed from the surface of the upper portion of the second conductive layer pattern 28. Hereinafter, the remaining protective layer 41A on the sidewalls of the second conductive layer pattern 28 is referred to as a protective layer 41.

Figure 4C:
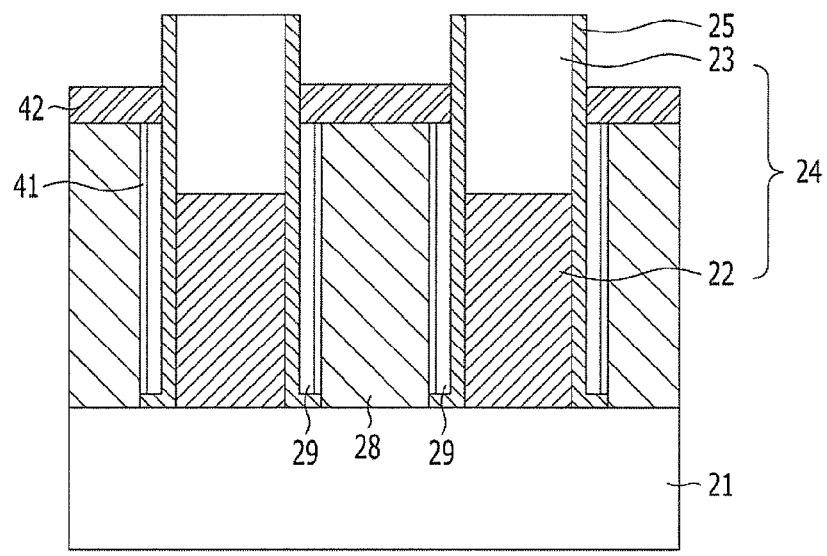

Referring to FIG. 4C, a capping layer 42 for capping the air gaps 29 is formed. The capping layer 42 may include a conductive material. The capping layer 42 may be formed through an epitaxial growth process. The capping layer 42 may be formed through a Selective Epitaxial Growth (SEG) process. The capping layer 42 may include a silicon-containing layer. The capping layer 42 may include a silicon epitaxial layer that is grown through the selective epitaxial growth process. The capping layer 42 may be formed through the selective epitaxial growth process from the surface of the second conductive layer pattern 28. For example, since the second conductive layer pattern 28 includes a silicon-containing layer, it may be possible to grow the capping layer 42 containing silicon over the second conductive layer pattern 28 through the selective epitaxial growth process. During the selective epitaxial growth process, the capping layer 42 is not grown on the sidewalls of the second conductive layer pattern 28 due to the protective layer pattern 41.

As described above, since the capping layer 42 is formed through the selective epitaxial growth process, the surface of the upper portion of the second conductive layer pattern 28 and the air gaps 29 may be capped sufficiently. Also, since the capping layer 30 is formed through the selective epitaxial growth process, it may be possible to prevent the air gaps 29 from being open in the subsequent process.

Since the capping layer 42 is formed to cover the surface of the upper portion of the second conductive layer pattern 28 and not formed on the sidewalls of the upper portion of an opening, top open margin of the opening may be secured. Also, as the capping layer 42 gap-fills a predetermined portion of the upper portion of the opening, the aspect ratio of the upper portion of the opening may be decreased.

Figure 4D:
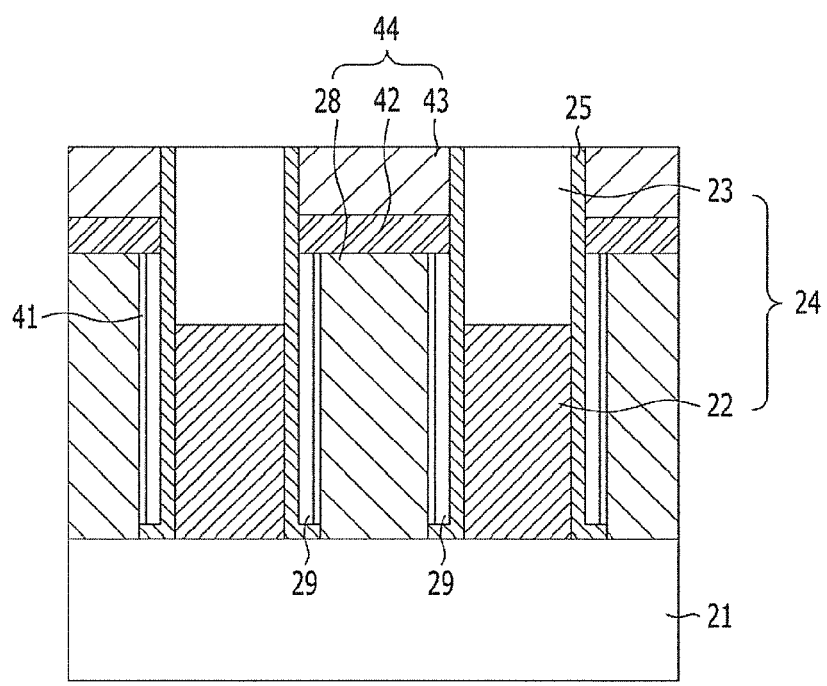

Referring to FIG. 4D, a third conductive layer pattern 43 may be formed over the capping layer 42. The third conductive layer pattern 43 may be formed by forming a third conductive layer that gap-fills the upper portion of the capping layer 42 and then performing a planarization process. The third conductive layer pattern 43 may include a metal-containing layer. The third conductive layer pattern 43 may include a tungsten layer. Although not illustrated in the drawing, the third conductive layer pattern 43 may further include a barrier layer. Therefore, the third conductive layer pattern 43 may be a stacked layer of a barrier layer and a metal-containing layer. The barrier layer may include a material containing titanium. The barrier layer may be formed of titanium alone, or the barrier layer may be a stacked layer of a titanium layer and a titanium nitride layer. When the third conductive layer pattern 43 includes a material that does not react with the second conductive layer pattern 28, the barrier layer may be omitted.

When the third conductive layer pattern 43 is formed as described above, each of second conductive structures 44 including the second conductive layer pattern 28, the capping layer 42, and the third conductive layer pattern 43 is formed. The air gaps 29 are formed between the first conductive structures 24 and the second conductive structures 44. The second conductive structures 44 may be storage node contact plugs. The second conductive layer pattern 28 may be a bottom plug of each of the storage node contact plugs, and the third conductive layer pattern 43 may be a top plug of each of the storage node contact plugs. Since the second conductive layer pattern 28 includes a silicon-containing layer and the third conductive layer pattern 43 includes a metal-containing layer, the contact plugs including the silicon-containing layers and the metal-containing layers, which are semi-metal contact plugs, may be formed.

The air gaps 29 may be formed between the first conductive layer patterns 22 and the second conductive layer patterns 28. When the first conductive layer patterns 22 include bit lines and the second conductive layer patterns 28 include storage node contact plugs, the air gaps 29 may be formed between the bit lines and the storage node contact plugs. When the first conductive layer patterns 22 includes gate electrodes and the second conductive layer patterns 28 include contact plugs, the air gaps 29 may be formed between the gate electrodes and the contact plugs.

Figure 5A:
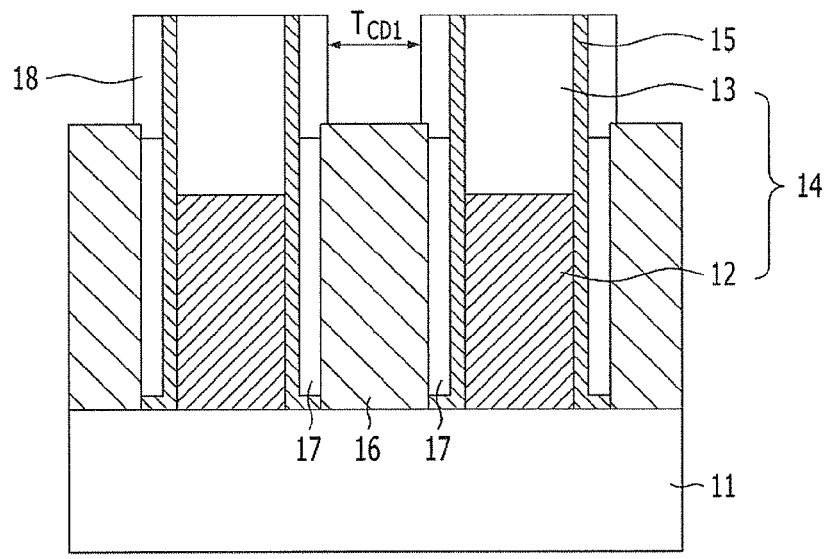
FIGS. 5A and 5B are cross-sectional views illustrating a comparative example of an embodiment of the present invention.
Figure 5B:
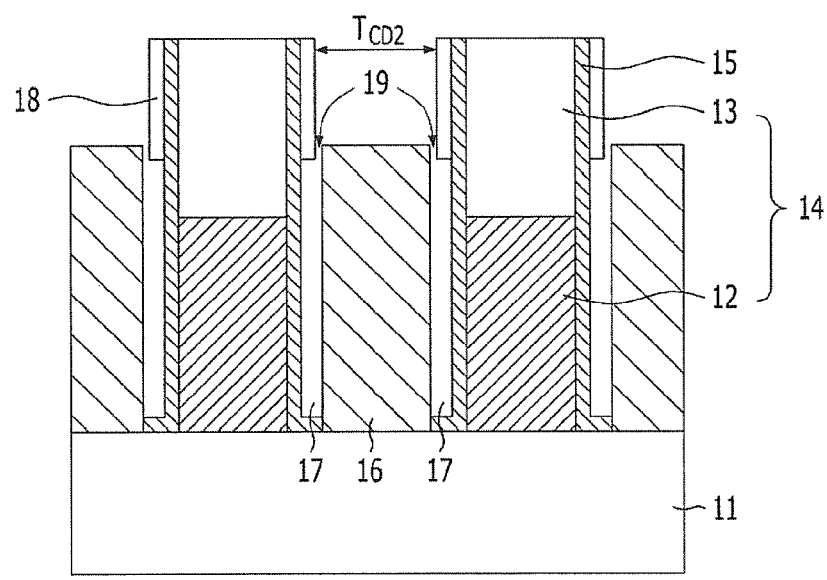

FIGS. 5A and 5B are cross-sectional views illustrating a comparative example of an embodiment of the present invention.

Referring to FIGS. 5A and 5B, a plurality of first conductive structures 14, each having a first conductive layer 12 and a hard mask layer 13 that are stacked, are formed over a substrate 11. A second conductive layer 16 of second conductive structures is formed between the first conductive structures 14. Air gaps 17 are formed between the first conductive structures 14 and the second conductive layer 16. Spacers 15 are formed on the sidewalls of the first conductive structures 14.

In this comparative example, a capping layer 18 may be formed of an insulating material. The capping layer 18 may be formed of silicon nitride or silicon oxide. Since the capping layer 18 may be formed of an insulating material, the capping layer 18 has to be selectively removed from the surface of the second conductive layer 16.

However, when the thickness of the capping layer 18 is increased to sufficiently cap the air gaps 17, top open margin $T_{CD1}$ is decreased and thus gap-fill failure such as void occurs in a third conductive layer that is to be formed subsequently. Also, the parasitic capacitance is not improved because the capping layer 18 flows into the air gaps 17. Moreover, the uniformity of the parasitic capacitance is deteriorated.

When the capping layer 18 is formed thin to secure top open margin $T_{CD2}$, as Illustrated in FIG. 5B, the capping layer 18 may not sufficiently cap the air gaps 17. When the capping layer 18 is formed of an insulating material, the top open margin and the air gap capping performance are in a trade-off relationship.

After all, when air gaps are capped with a conductive capping layer just as in the embodiments of the present invention, the top open margin is secured and the air gaps 17 are sufficiently capped as well.

Figure 6A:
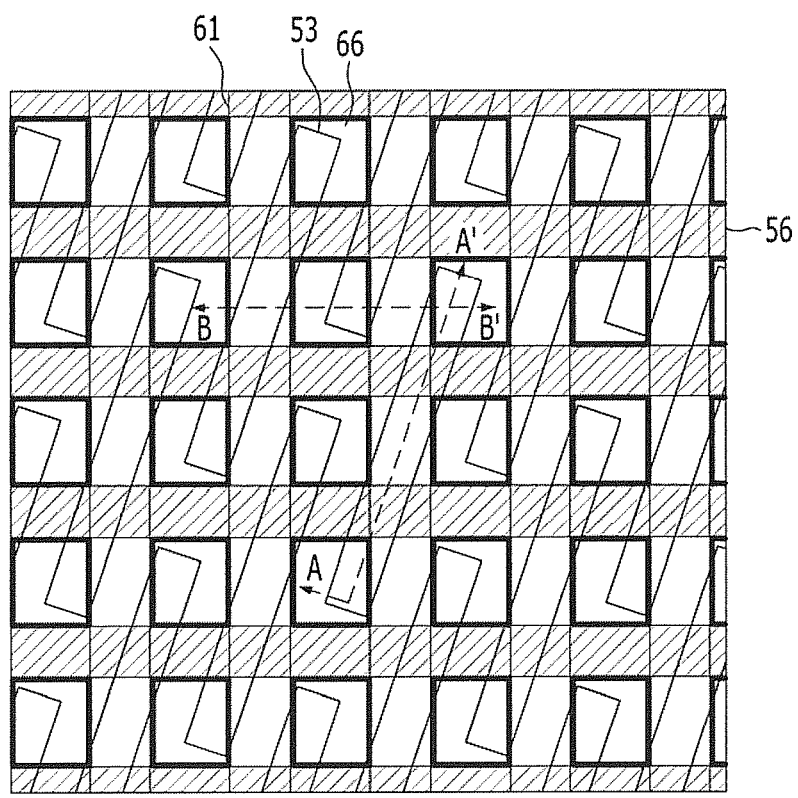
FIG. 6A illustrates memory cells of a Dynamic Random Access Memory (DRAM) device.
Figure 6B:
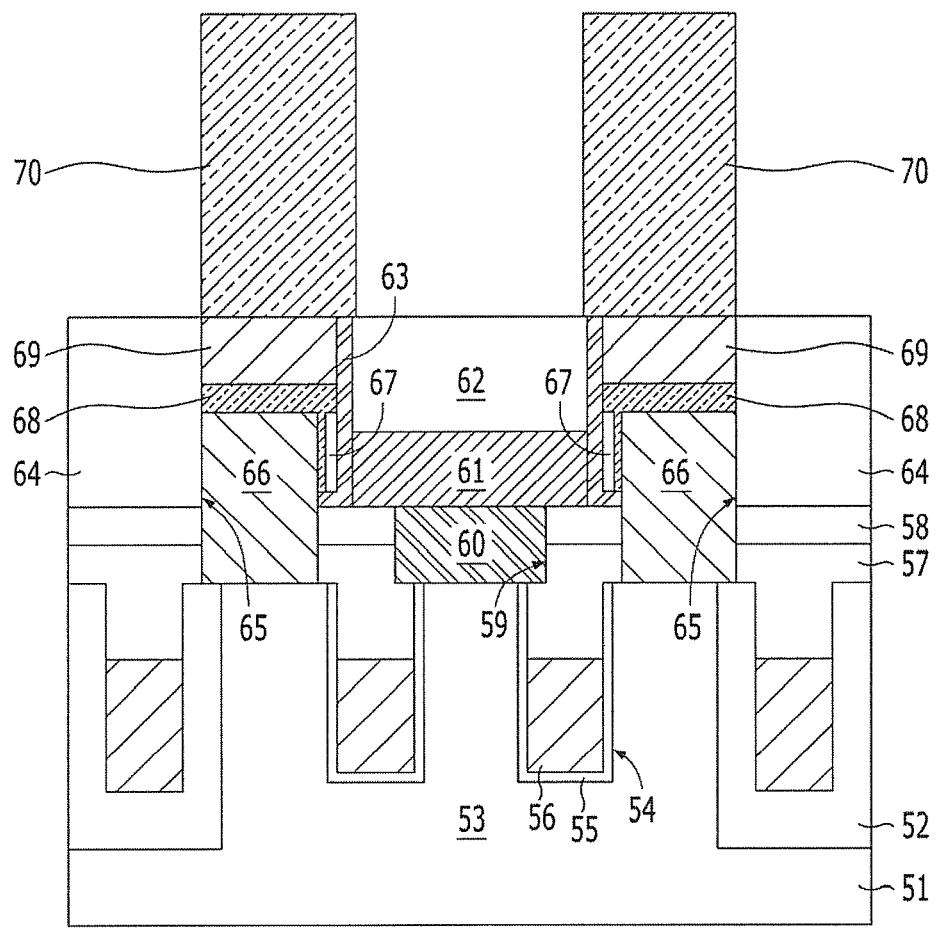
FIG. 6B is a cross-sectional view of the memory cells taken by cutting the memory cells shown in FIG. 6A along an A-A' line.

FIG. 6A illustrates memory cells of a Dynamic Random Access Memory (DRAM) device. FIG. 6B is a cross-sectional view of the memory cells taken by cutting the memory cells of FIG. 6A along an A-A' line, and FIG. 6C is a cross-sectional view of the memory cells taken by cutting the memory cells of FIG. 6A along a B-B' line.

Figure 6C:
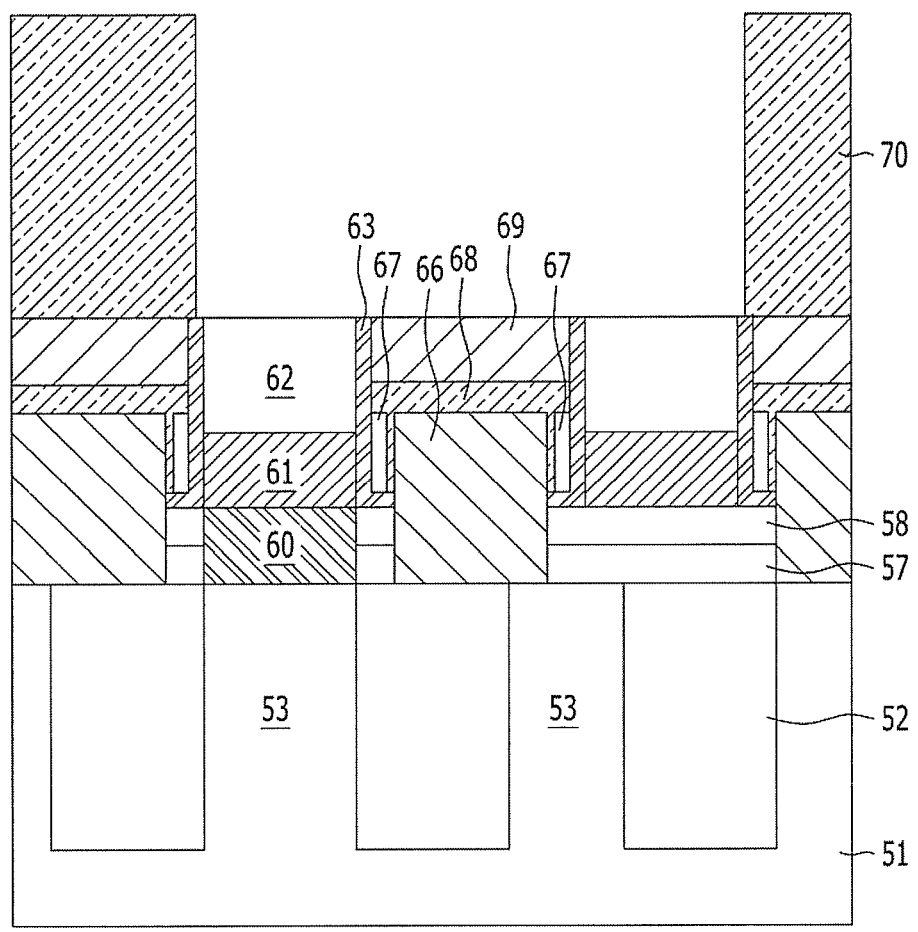
FIG. 6C is a cross-sectional view of the memory cells taken by cutting the memory cells shown in FIG. 6A along a B-B' line.

Referring to FIGS. 6A, 6B and 6C, active regions 53 are defined over a substrate 51 by isolation regions 52. Buried gate electrodes 56 are formed in trenches 54 that go across the active regions 53 and the isolation regions 52. Bit lines 61 stretched in a direction crossing the buried gate electrodes 56 are formed in the upper portion of the substrate 51. The bit lines 61 are coupled with the active regions 53 through bit line contact plugs 60. Storage node contact plugs are formed to be coupled with the active regions 53. Each of the storage node contact plugs includes a first plug 66, a capping layer 68, and a second plug 69 that are stacked therein. A storage node 70 of a capacitor is formed over the second plug 69 of each of the storage node contact plugs.

The storage node contact plugs may correspond to the second conductive structures according to the embodiments of the present invention, and the bit lines may correspond to the first conductive layer patterns of the first conductive structures. Therefore, air gaps 67 may be formed between the storage node contact plugs and the bit lines 61. Each of the storage node contact plugs may include the first plug 66 and the second plug 69, and a conductive capping layer 68 may be further formed between the first plug 66 and the second plug 69. The capping layer 68 may cap the first plug 66 and the air gaps 67. The capping layer 68 may correspond to the capping layer according to the embodiments of the present invention, and thus the capping layer 68 may be formed through a Selective Epitaxial Growth (SEG) process.

Referring to FIGS. 6A, 6B and 6C, a method for forming the memory cells is described hereinafter.

The substrate 51 may include a semiconductor material. The substrate 51 may include a semiconductor substrate. The substrate 51 may include a silicon substrate. For example, the substrate 51 may include a monocrystalline silicon substrate. The isolation regions 52 may be formed through a Shallow Trench Isolation (STI) process. The isolation regions 52 may define the active regions 53. The isolation region 52 may include a wall oxide, a liner, and a gap-fill material, which are sequentially formed. The liner may include silicon nitride or silicon oxide. The silicon nitride may include $Si_3N_4$, and the silicon oxide may include $SiO_2$. The gap-fill material may include silicon oxide, such as a spin-on-dielectric (SOD) substance. The gap-fill material may also include silicon nitride. Herein, the silicon nitride may include silicon nitride that is used as a liner.

The trenches 54 may be simultaneously formed in the active regions 53 and the isolation regions 52. The trenches 54 in the isolation regions 52 are formed deeper than those in the active regions 53 due to the etch rate difference between the active regions 53 and the isolation regions 52.

A gate insulation layer 55 may be formed on the surface of each of the trenches 54 before the buried gate electrodes 56 are formed in the trenches 54. The buried gate electrodes 56 may be formed by forming a metal-containing layer to gap-fill the trenches 54 and then performing an etch-back process. The metal-containing layer may include a material having such a metal as titanium, tantalum, and tungsten as its major component. The metal-containing layer may include at least any one selected from the group consisting of tantalum nitride (TaN), titanium nitride (TiN), tungsten nitride (WN), and tungsten (W). For example, the buried gate electrode 56 may include titanium nitride (TiN), tantalum nitride (TaN), or tungsten alone. The buried gate electrode 56 may have a two-layer structure where a tungsten (W) layer is stacked over a titanium nitride (TiN) layer ("TiN/W") or a tungsten (W) layer is stacked over a tantalum nitride (TaN) ("TaN/W"). Also, the buried gate electrode 56 may have a two-layer structure where a tungsten (W) layer is stacked over a tungsten nitride (WN) layer ("WN/W"). Besides, the buried gate electrode 56 may include a metal-containing material having a low resistance.

A sealing layer 57 is formed over the buried gate electrode 56. The sealing layer 57 may gap-fill the trench 54 over the buried gate electrode 56. The sealing layer 57 may protect the buried gate electrode 56 from the subsequent process. The sealing layer 57 may include an insulating material. The sealing layer 57 may include a silicon nitride.

After a first inter-layer dielectric layer 58 is formed, a bit line contact hole 59 is formed by etching the first inter-layer dielectric layer 58 and the sealing layer 57. Subsequently, a bit line contact plug 60 is formed by forming a conductive layer in the bit line contact hole 59. Bit line structures each including a bit line 61 and a bit line hard mask layer 62 are formed over the bit line contact plugs 60. The bit line contact plug 60 may include a polysilicon layer or a metal-containing layer. The bit line 61 may include a tungsten layer, and may include a barrier layer, such as Ti/TiN, and a tungsten layer over the barrier layer. The bit line hard mask layer 62 may include a silicon nitride.

Spacers 63 are formed on both sidewalls of each bit line structure. Subsequently, a second inter-layer dielectric layer 64 is formed, and then a storage node contact hole 65 are formed by etching the second inter-layer dielectric layer 64, the first inter-layer dielectric layer 58, and the sealing layer 57. Sacrificial spacers (not shown) are formed on the sidewalls of the storage node contact hole 65, and the first plug 66 are recessed in the storage node contact hole 65. Subsequently, the air gaps 67 are formed by removing the sacrificial spacers (not shown).

Subsequently, the capping layer 68 is grown from the surface of the first plug 66 so as to cap the air gaps 67 and the first plug 66.

The second plug 69 is formed over the capping layer 68. The second plug 69 may include a metal-containing layer. The second plug 69 may include a tungsten layer. Although not illustrated in the drawing, the second plug 69 may further include a barrier layer. Therefore, the second plug 69 may be formed by stacking of the barrier layer and the metal-containing layer. The barrier layer may include a titanium-containing material. The barrier layer may be formed of titanium alone, or the barrier layer may be formed by stacking of a titanium layer and a titanium nitride layer.

The storage node 70 of a capacitor is formed over the second plug 69. The storage node 70 may have a cylindrical shape. According to another embodiment of the present invention, the storage node 70 may have a pillar shape. Although not illustrated in the drawing, a dielectric layer and a plate node may be further formed over the storage node 70.

According to another embodiment of the present invention, the memory cells of a DRAM device may include a contact structure illustrated in FIG. 3. In other words, the protective layer may prevent the capping layer from being epitaxially grown.

The contact structures according to the above-described embodiments of the present invention may be applied not only to DRAM devices, but also to Static Random Access Memory (SRAM) devices, flash memory devices, Ferroelectric Random Access Memory (FeRAM) devices, Magnetic Random Access Memory (MRAM) devices, Phase Change Random Access Memory (PRAM) devices and so forth.

Figure 7:
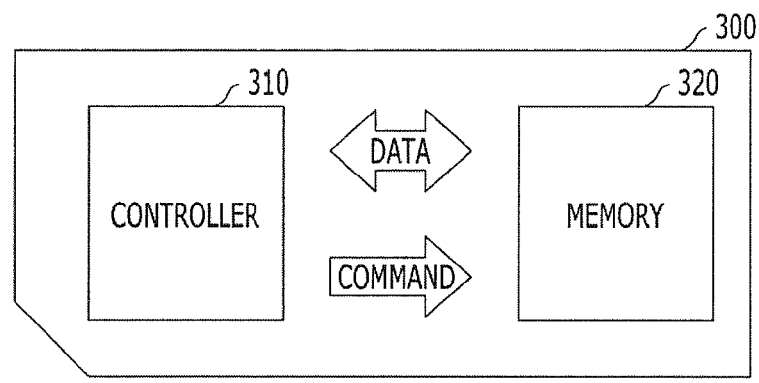
FIG. 7 illustrates a memory card.

FIG. 7 illustrates a memory card. Referring to FIG. 7, the memory card 300 may include a controller 310 and a memory 320. The controller 310 and the memory 320 may exchange electrical signals. To be specific, the memory 320 transmits data upon receipt of commands from the controller 310. Accordingly, the memory card 300 may store the data in the memory 320 or output the data from the memory 320 to the outside. A particular part of the memory 320 may include the contact structures which are described above. The memory card 300 may be used as a data storage medium for diverse portable devices. For example, the memory card 300 may include a memory stick card, a smart media card (SM), a secure digital card (SD), a mini secure digital card (mini SD), or a multimedia card (MMC).

Figure 8:
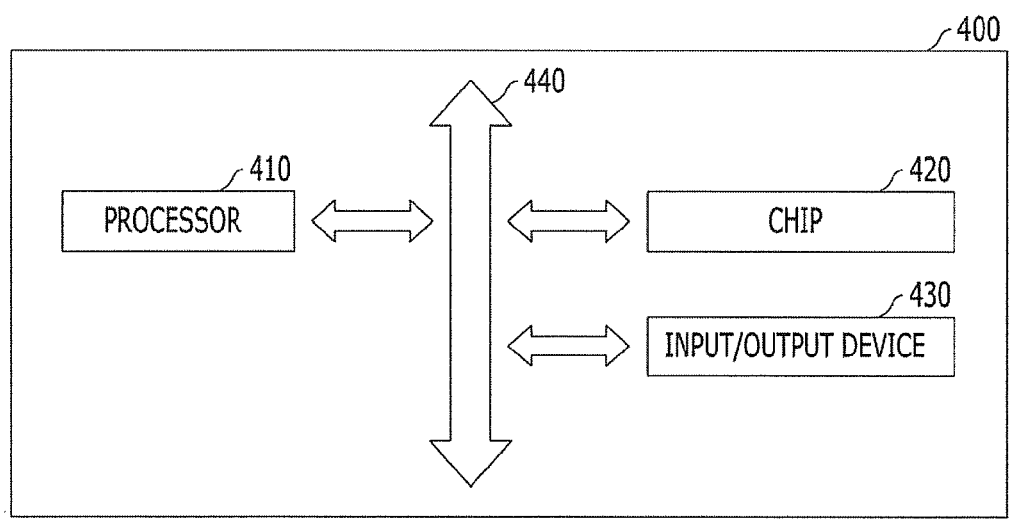
FIG. 8 is a block view illustrating an electronic system.

FIG. 8 is a block view illustrating an electronic system. Referring to FIG. 8, the electronic system 400 may include a processor 410, an input/output device 430, and a chip 420. The processor 410, the chip 420, and the input/output device 430 may perform data communication with each other through a bus 440. The processor 410 implements a program and controls the electronic system 400. The input/output device 430 is used to input or output data to or from the electronic system 400. The electronic system 400 may be connected to an external device, such as a personal computer or a network, and exchange data with the external device by using the input/output device 430. The chip 420 may store codes and data for the operation of the processor 410, and the chip 420 may perform some operations commanded by the processor 410. For example, the chip 420 may include the above-described contact structures. The electronic system 400 may be diverse electronic control devices requiring the chip 420. The electronic system 400 may be used for mobile phones, MP3 players, navigators, solid-state disk (SSD), and household appliances.

According to one embodiment of the present invention, the parasitic capacitance between conductive structures may be decreased by forming air gaps between the conductive structures because the air gaps have a low dielectric rate.

Also, since the air gaps are formed using a conductive capping layer, the air gaps may be protected from being open in the subsequent process. Moreover, since the capping layer fills a part of the upper portion of each opening, an open margin may be secured in the upper portion of each opening.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   forming a plurality of bit line structures over a substrate;
   forming contact holes between the bit line structures;
   forming sacrificial spacers on sidewalls of the bit line structures;
   forming first plugs recessed inside the contact holes;
   forming air gaps by removing the sacrificial spacers;
   forming protective layers on sidewalls of the first plugs;
   forming conductive capping layers on the first plugs and the air gaps to cover the first plugs and the air gaps; and
   forming second plugs over the conductive capping layers,
   wherein the conductive capping layers are formed directly from surfaces of the first plugs through an epitaxial growth process.

2. The method of claim 1, wherein the forming of protective layers includes:
   forming an oxide layer by oxidizing an surface and sidewalls of each of the first plugs; and
   selectively removing the oxide layer to expose the surface of each of the first plugs.

3. The method of claim 1, wherein the conductive capping layers are formed by performing an epitaxial growth process on silicon.

4. The method of claim 1, wherein the first plugs include polysilicon layers, and the conductive capping layers are formed from surfaces of the first plugs by performing a selective epitaxial growth process on silicon.

5. The method of claim 1, wherein the forming of sacrificial spacers includes:
   forming a sacrificial layer over the substrate including the contact holes; and
   forming the sacrificial spacers by etching the sacrificial layer.

6. The method of claim 5, wherein the sacrificial layer includes titanium nitride.

\* \* \* \* \*